United States Patent
Lee (10) Patent No.: US 8,169,842 B2
(45) Date of Patent: May 1, 2012

(54) SKEW DETECTOR AND SEMICONDUCTOR MEMORY DEVICE USING THE SAME

(75) Inventor: Seong-Jun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 303 days.

(21) Appl. No.: 12/648,335

(22) Filed: Dec. 29, 2009

(65) Prior Publication Data

US 2011/0158010 A1     Jun. 30, 2011

(30) Foreign Application Priority Data

Dec. 28, 2009 (KR) .................. 10-2009-0132038

(51) Int. Cl.
*G11C 7/00* (2006.01)
(52) U.S. Cl. .................. 365/194; 365/189.07; 365/198; 713/503
(58) Field of Classification Search .................. 365/198
See application file for complete search history.

(56) References Cited

U.S. PATENT DOCUMENTS

| | | | | |
|---|---|---|---|---|
| 6,618,283 B2 * | 9/2003 | Lin | ................ | 365/141 |
| 7,430,142 B2 * | 9/2008 | Kojima | ................ | 365/194 |
| 7,441,139 B2 * | 10/2008 | Kuwata | ................ | 713/503 |
| 7,616,022 B2 * | 11/2009 | Hur et al. | ................ | 324/762.09 |
| 7,957,218 B2 * | 6/2011 | Welker | ................ | 365/233.13 |
| 2009/0019323 A1 | 1/2009 | Porterfield | | |

FOREIGN PATENT DOCUMENTS

KR    1019990062446    7/1999
KR    1020100076611    7/2010

OTHER PUBLICATIONS

Notice of Preliminary Rejection issued from Korean Intellectual Property Office on May 2, 2011.
Notice of Allowance issued from Korean Intellectual Property Office on Aug. 1, 2011.

* cited by examiner

*Primary Examiner* — Tan T. Nguyen
(74) *Attorney, Agent, or Firm* — IP & T Group LLP (57) ABSTRACT

A skew detection circuit includes a data sensing block configured to sense a first data that is transferred earliest and a last data that is transferred latest among a plurality of data which are transferred through different transfer paths, and generate a sensing result signal; and a detection signal generation block configured to compare an output signal of the data sensing block with a certain time, and generate a skew detection signal.

29 Claims, 6 Drawing Sheets

SKEW DETECTOR AND SEMICONDUCTOR MEMORY DEVICE USING THE SAME

CROSS-REFERENCE TO RELATED APPLICATIONS

The present application claims priority of Korean Patent Application No. 10-2009-0132038, filed on Dec. 28, 2009, which is incorporated herein by reference in its entirety.

BACKGROUND OF THE INVENTION

Exemplary embodiments of the present invention relate to a semiconductor design technology, and more particularly, to a semiconductor memory device in which various parameters for a minimum margin of data transfer are prescribed according to a specification.

Generally, in a semiconductor memory device including a Double Data Rate Synchronous DRAM (DDR SDRAM), various parameters are prescribed according to a specification. Examples of the parameters include 'tAC', 'tDQSCK', 'tDQSS', and the like. 'tAC' is a parameter which relates to a clock signal and a data, and 'tDQSCK' is a parameter which relates to the clock signal and a data strobe signal. 'tDQSS' is a parameter which relates to the data and the data strobe signal. A test operation is performed on the semiconductor memory device before mass-producing the semiconductor memory device in order to determine whether the parameters are properly guaranteed.

As an example, for illustration purposes, 'tAC' is described in detail. As mentioned above, 'tAC' is the parameter which relates to the clock signal and the data. 'tAC' is defined as a minimum value and a maximum value where the data is desired to be positioned with respect to a rising edge of the clock signal. In other words, the data transferred through different transfer paths have different transfer timings due to various factors; however, despite occurrence of such a data skew in comparison with the clock signal, it is possible for the semiconductor memory device to perform a desired operation. Accordingly, 'tAC' defines a range of a permissible the data skew where the semiconductor memory device can perform normal operations.

For instance, in performing a test which relates to 'tAC' for the semiconductor memory device which outputs 16 pieces of data, 16 probe pins may be allocated in a test equipment and a test operation may be sequentially performed on each data output terminal through a respective probe pin. During the test operation, the test equipment detects 'tAC' of each subsequent data output terminal after detecting 'tAC' corresponding to a first data output terminal and detects 'tAC' of each of the 16 data output terminals and transfer the detection result to a test operator. Based on the detection result, the test operator adjusts an output timing of the latest output data.

Meanwhile, time for testing a semiconductor memory device is an important factor that determines the cost of the semiconductor memory device. Therefore, extensive efforts have been made to reduce the test time. One way to reduce the test time has been to reduce the number of probe pins allocated to a semiconductor memory device. Reduction in the number of probe pins often results in an increase in the number of semiconductor memory devices that the test equipment can simultaneously test. Thus, the test time for each semiconductor memory device can be reduced in testing a number of the semiconductor memory devices.

However, in performing the test operation for determining 'tAC' for a semiconductor memory device, it may be difficult to reduce the number of allocated probe pins since the test operation is typically performed on all of the data output terminals. While reduction in the number of allocated probe pins may be achieved by testing representative data output terminals, 'tAC' of the remaining data output terminals is not guaranteed. Accordingly, semiconductor memory devices may not operate reliably.

SUMMARY OF THE INVENTION

An embodiment of the present invention is directed to a semiconductor memory device capable of generating a single sensing result signal by sensing a skew among a plurality of data transferred through different paths and detecting the sensing result signal through a single test pin.

Another embodiment of the present invention is directed to a semiconductor memory device capable of detecting a skew generated when a plurality of data are transferred and applying the detected skew to an internal clock signal.

In accordance with an embodiment of the present invention, a skew detection circuit includes: a data sensing block configured to sense a first data that is transferred earliest and a last data that is transferred latest among a plurality of data which are transferred through different transfer paths, and generate a sensing result signal; and a detection signal generation block configured to compare an output signal of the data sensing unit with a certain time, and generate a skew detection signal.

In accordance with another embodiment of the present invention, a semiconductor memory device includes: a data sensing block configured to sense a first data that is transferred earliest and a last data that is transferred latest among a plurality of data which are transferred through different transfer paths and synchronized with an internal clock signal, and generate a sensing result signal; a control signal generation block configured to compare a signal, which is generated by delaying an external clock signal by a certain time, with the sensing result signal, and generate a control signal; and an internal clock signal generation block configured to receive the external clock signal and adjust the internal clock signal in response to the control signal.

In accordance with still another embodiment of the present invention, a method for detecting a data skew includes: comparing a time between transfers of a first data and a last data among a plurality of data transferred through different transfer paths, with a certain time, and detecting a comparison result; and outputting the comparison result through a single pad.

In accordance with still another embodiment of the present invention, a method for operating a semiconductor memory device includes: sensing a time between transfers of a first data and a last data among a plurality of data, which are transferred through different transfer paths in sync with an internal clock signal, and generating a sensing result signal; and comparing a signal, which is generated by delaying an external clock signal by a certain time, with the sensing result signal, and controlling a delay amount of the internal clock signal.

DESCRIPTION OF SPECIFIC EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
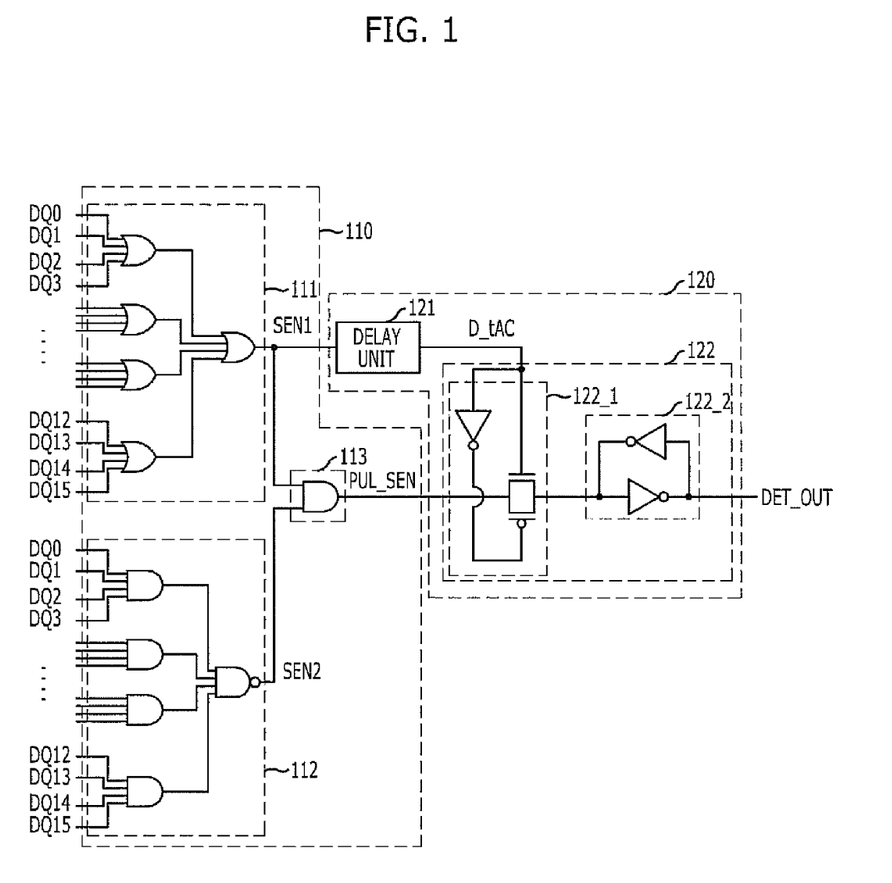
FIG. 1 is a circuit diagram illustrating a skew detection circuit of a semiconductor memory device in accordance with an embodiment of the present invention.

FIG. 1 is a circuit diagram illustrating a skew detection circuit of a semiconductor memory device in accordance with an embodiment of the present invention.

Referring to FIG. 1, the skew detection circuit includes a data sensing block 110 and a detection signal generation block 120.

The data sensing block 110 is configured to sense a first data that is transferred earliest and a last data that is transferred latest among a plurality of output data DQ<0:15> which are transferred through different transfer paths, and generate a sensing result signal PUL_SEN. The data sensing block 110 includes a first data sensing unit 111, a second data sensing unit 112, and a sensing result output unit 113.

The first data sensing unit 111 is configured to sense the first data (that is, firstly transferred) among the plurality of output data DQ<0:15> and output a first sensing signal SEN1. The first data sensing unit 111 may be implemented with a plurality of OR gates. The second data sensing unit 112 is configured to sense the last data (that is, lastly transferred) among the plurality of output data DQ<0:15> and output a second sensing signal SEN2. The second data sensing unit 112 may be implemented with a plurality of AND gates and a NAND gate. In this example, the first data sensing unit 111 changes the first sensing signal SEN1 from a logic low to a logic high in response to a data which firstly changes from a logic low to a logic high among the plurality of output data DQ<0:15>. The second data sensing unit 112 changes the second sensing signal SEN2 from a logic high to a logic low when all of the plurality of output data DQ<0:15> change to a logic high.

The sensing result output unit 113 is configured to output the sensing result signal PUL_SEN corresponding to the first sensing signal SEN1 and the second sensing signal SEN2. The sensing result output unit 113 includes an AND gate. While the sensing result signal PUL_SEN has a pulse width of a logic high corresponding to a time between the transfers of the first data and the last data among the plurality of output data DQ<0:15>.

The detection signal generation block 120 is configured to compare the sensing result signal PUL_SEN with a certain time corresponding to 'tAC', and output a skew detection signal DET_OUT. The detection signal generation block 120 includes a delay unit 121 and a detection signal output unit 122.

The delay unit 121 is configured to delay the first sensing signal SEN1 by a certain time corresponding to 'tAC' and output the delayed signal as a delay control signal D_tAC. The delay unit 121 may be implemented with any reasonably suitable delay circuit which delays an input signal. The detection signal output unit 122 is configured to output the sensing result signal PUL_SEN as the skew detection signal DET_OUT in response to the delay control signal D_tAC. The detection signal output unit 122 includes a transferring unit 122_1 and a latching unit 122_2. The transferring unit 122_1 is configured to transfer the sensing result signal PUL_SEN in response to the delay control signal D_tAC. The latching unit 122_2 is configured to latch an output signal of the transferring unit 122_1 and output the skew detection signal DET_OUT.

The skew detection circuit in accordance with the embodiment of the present invention converts information about transfer timings of the first data and the last data among the plurality of output data DQ<0:15> which are transferred through different transfer paths into the single sensing result signal PUL_SEN. Then, the sensing result signal PUL_SEN is compared with a time corresponding to 'tAC', and the single skew detection signal DET_OUT is generated.

Figure 2:
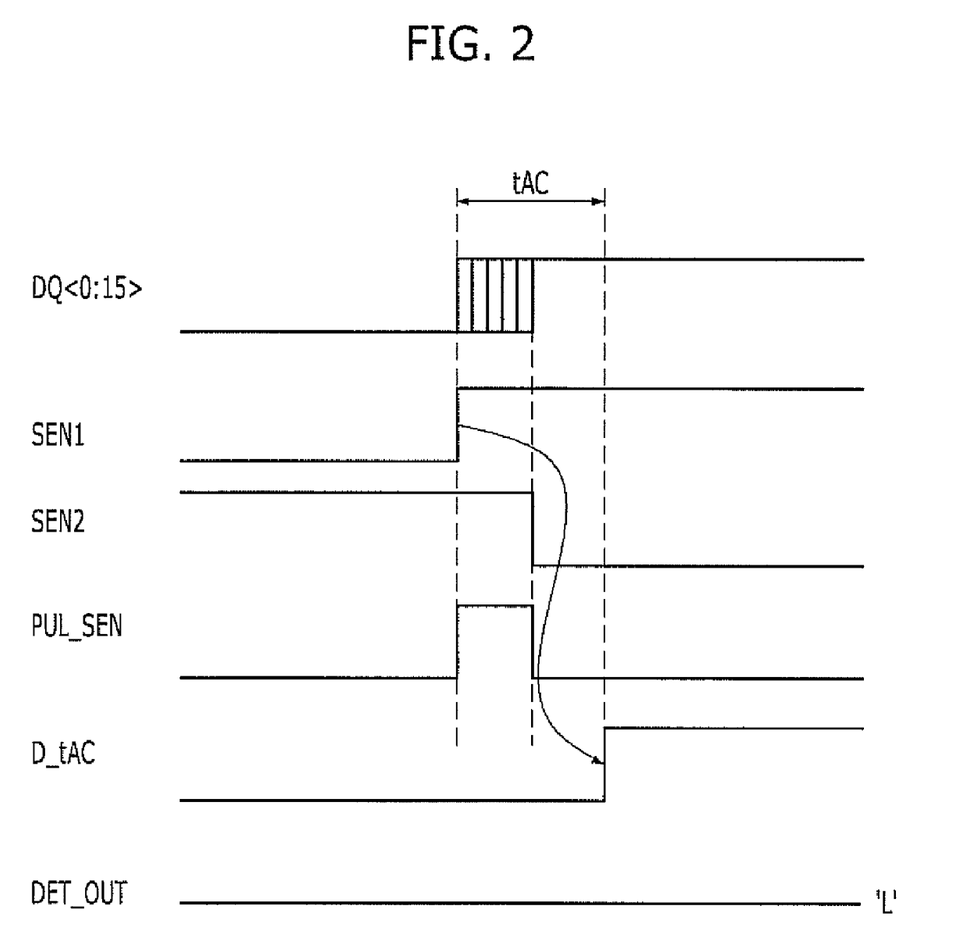
FIGS. 2 and 3 are timing diagrams illustrating the operations of the skew detection circuit of FIG. 1.
Figure 3:
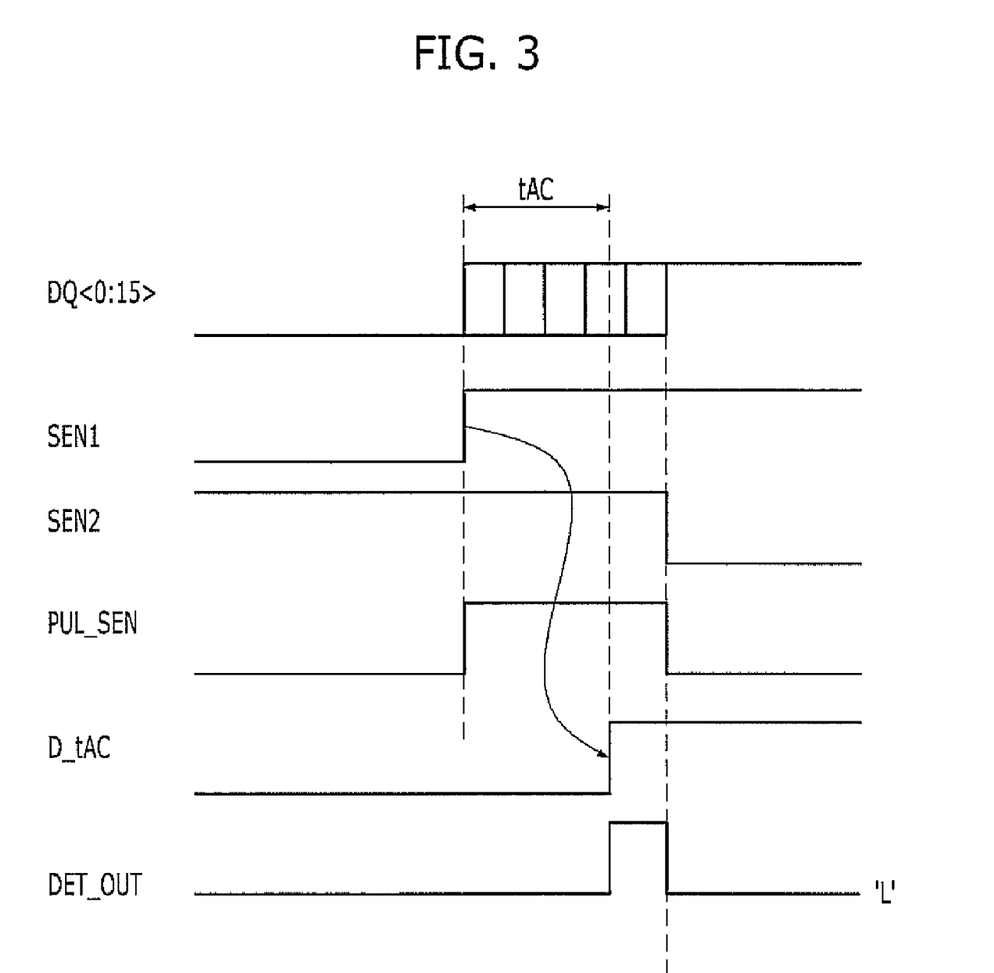

FIGS. 2 and 3 are timing diagrams illustrating the operations of the skew detection circuit in FIG. 1.

Specifically, FIG. 2 illustrates the case where the skew among the plurality of output data DQ<0:15> is within a time range corresponding to 'tAC'.

Referring to FIGS. 1 and 2, the first sensing signal SEN1 changes to a logic high in response to a timing when the first data among the plurality of output data DQ<0:15>, i.e., the data which firstly changes to a logic high, is transferred. The second sensing signal SEN2 changes to a logic low in response to a timing when the last data among the plurality of output data DQ<0:15> (thus, all of the output data) change to a logic high. The sensing result output unit 113 generates the sensing result signal PUL_SEN which has a pulse width corresponding to a time between the foregoing changes in the first sensing signal SEN1 and the second sensing signal SEN2. Thus, the sensing result signal PUL_SEN has the pulse width corresponding to a time between the transfer of the first data and the transfer of the last data among the plurality of output data DQ<0:15>.

Meanwhile, the first sensing signal SEN1 is delayed by a time corresponding to 'tAC' in the delay unit 121 and is outputted as the delay control signal D_tAC. The sensing result signal PUL_SEN is outputted as the skew detection signal DET_OUT in response to the delay control signal D_tAC. In this case, since the sensing result signal PUL_SEN has a logic low at the timing when the delay control signal D_tAC changes to a logic high, the skew detection signal DET_OUT becomes a logic low. As a result, in the case where the skew among the plurality of output data DQ<0:15> is within a range of a time corresponding to 'tAC', the skew detection signal DET_OUT has a logic low.

FIG. 3 illustrates the case where the skew among the plurality of output data DQ<0:15> is outside a time range corresponding to 'tAC'.

Referring to FIGS. 1 and 3, logic levels of the first sensing signal SEN1 and the second sensing signal SEN2 change in response to the first data and the last data among the plurality of output data DQ<0:15>, and the sensing result signal PUL_SEN has pulse width corresponding to a time period between the changes. Thereafter, the skew detection signal DET_OUT is outputted in response to the delay control signal D_tAC which is outputted from the delay unit 121. In this case, since the sensing result signal PUL_SEN has a logic high when the delay control signal D_tAC changes to a logic high, the skew detection signal DET_OUT becomes a signal having a logic high. As a result, in the case where the skew among the plurality of output data DQ<0:15> is outside a time range corresponding to 'tAC', the skew detection signal DET_OUT has a logic high.

The skew detection circuit in accordance with the embodiment of the present invention may generate the skew detection signal DET_OUT which has a logic low or a logic high according to whether skew among the plurality of output data DQ<0:15> is within a time range of 'tAC' or not. The skew detection signal DET_OUT generated in this manner is transferred to a test equipment through a single pad, and the test equipment may detect 'tAC' of the plurality of output data DQ<0:15> based on the skew detection signal DET_OUT. Thus, the test equipment can detect 'tAC' of the semiconductor memory device through a single probe pin.

Figure 4:
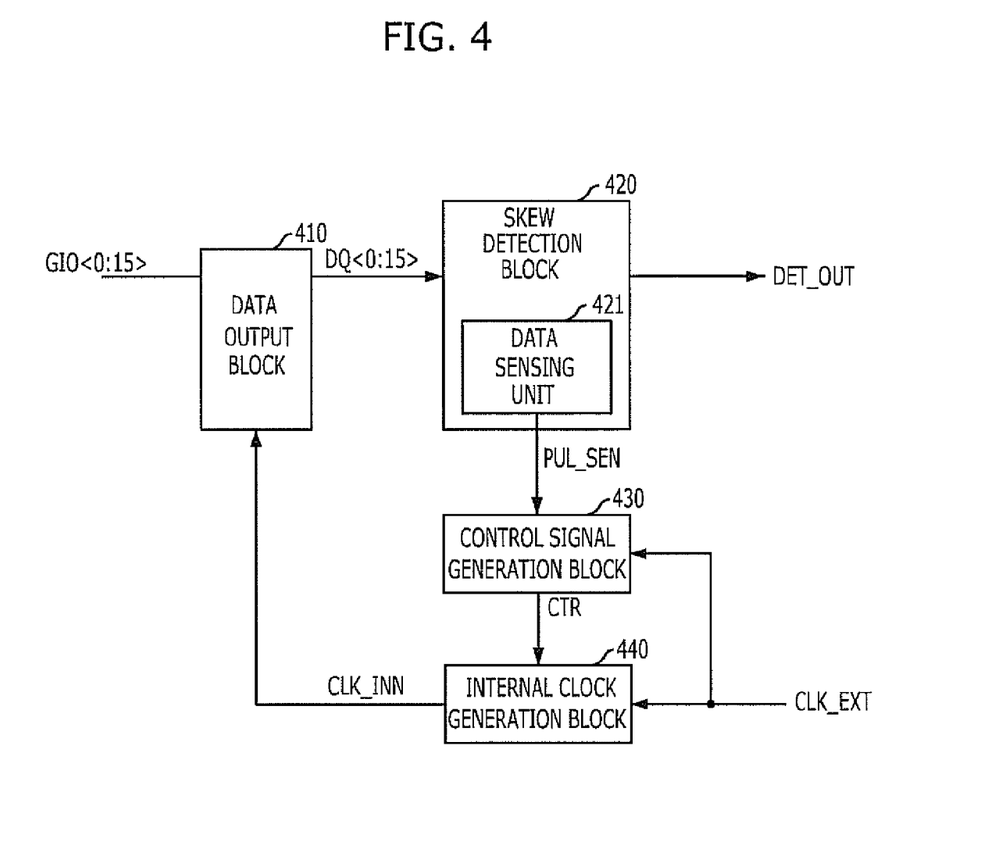
FIG. 4 is a block diagram illustrating the partial structure of the semiconductor memory device having the skew detection circuit of FIG. 1.

FIG. 4 is a block diagram illustrating the partial structure of the semiconductor memory device having the skew detection circuit of FIG. 1. A skew detection block 420 corresponds to the skew detection circuit of FIG. 1. The skew detection block 420 includes a data sensing unit 421 which corresponds to the data sensing block 110.

Referring to FIG. 4, the semiconductor memory device includes a data output block 410, the skew detection block 420, a control signal generation block 430, and an internal clock generation block 440.

The data output block 410 is configured to receive a plurality of data through a plurality of global data lines GIO<0:15>, synchronize the received data with an internal clock signal CLK_INN, and output the synchronized data as a plurality of output data DQ<0:15>. Herein, the plurality of global data lines GIO<0:15> are lines configured to transfer data stored in the semiconductor memory device. While not shown, the plurality of output data DQ<0:15> are outputted to the outside during a normal operation through a pad provided in the semiconductor memory device.

The skew detection block 420 is configured to detect 'tAC' of the plurality of output data DQ<0:15>. The skew detection block 420 includes the data sensing unit 421 as mentioned above. The data sensing unit 421 is configured to sense a first data that is transferred earliest and a last data that is transferred latest among the plurality of output data DQ<0:15> that are transferred through different transfer paths from the data output block 410, and generate the sensing result signal PUL_SEN. The sensing result signal PUL_SEN has a pulse width which corresponds to a time between the occurrences of the first data and the last data.

The control signal generation block 430 is configured to compare a delayed clock signal D_tAC/2, which is generated by delaying an external clock signal CLK_EXT by a certain time, with the sensing result signal PUL_SEN, and generate a control signal CTR.

Figure 5:
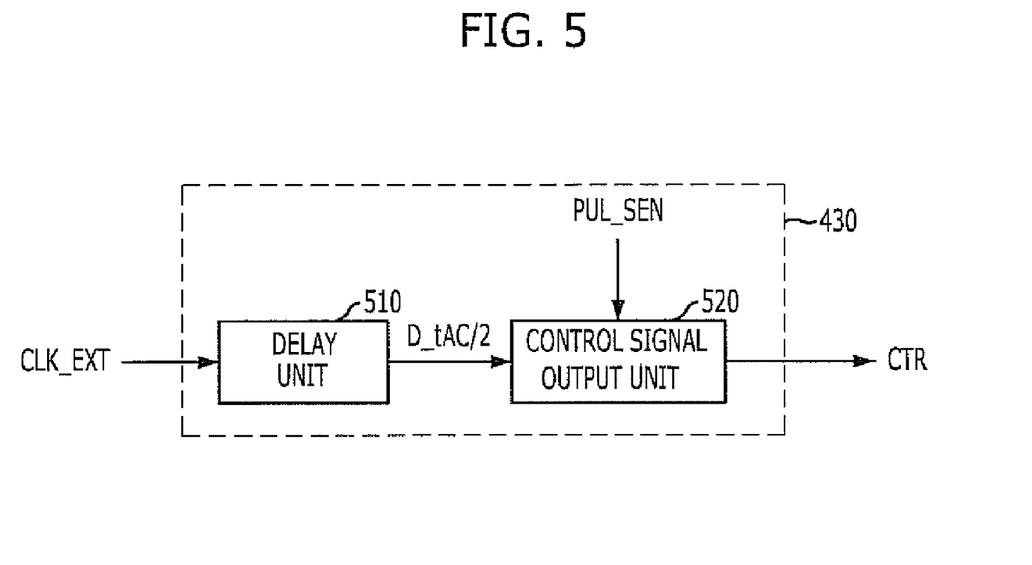
FIG. 5 is a block diagram illustrating a control signal generation unit of FIG. 4.

FIG. 5 is a block diagram of the control signal generation block 430 of FIG. 4.

Referring to FIG. 5, the control signal generation block 430 includes a delay unit 510 and a control signal output unit 520. The delay unit 510 is configured to delay the external clock signal CLK_EXT by the certain time and generate the delayed clock signal D_tAC/2. The control signal output unit 520 is configured to generate the control signal CTR in response to the delayed clock signal D_tAC/2 and the sensing result signal PUL_SEN. Herein, the delay unit 510 has a delay amount corresponding to ½ of 'tAC'. The delay amount of the delay unit 510 is described below.

Meanwhile, referring again to FIG. 4, the internal clock generation block 440 receives the external clock signal CLK_EXT and generates the internal clock signal CLK_INN whose delay amount is adjusted in response to the control signal CTR. Herein, the internal clock generation unit 440 may be implemented with a delay locked loop (DLL) or a phase locked loop (PLL).

The semiconductor memory device generates the internal clock signal CLK_INN, which is used as a reference for various operations of the semiconductor memory device. One such operation is to synchronize data when internally transferred data are outputted to the outside. The data outputted in synchronization with the internal clock signal CLK_INN is in synchronization with the external clock signal CLK_EXT. Herein, the possible phase relation between the plurality of output data DQ<0:15> and the external clock signal CLK_EXT are illustrated in FIGS. 6 and 7.

Figure 6:
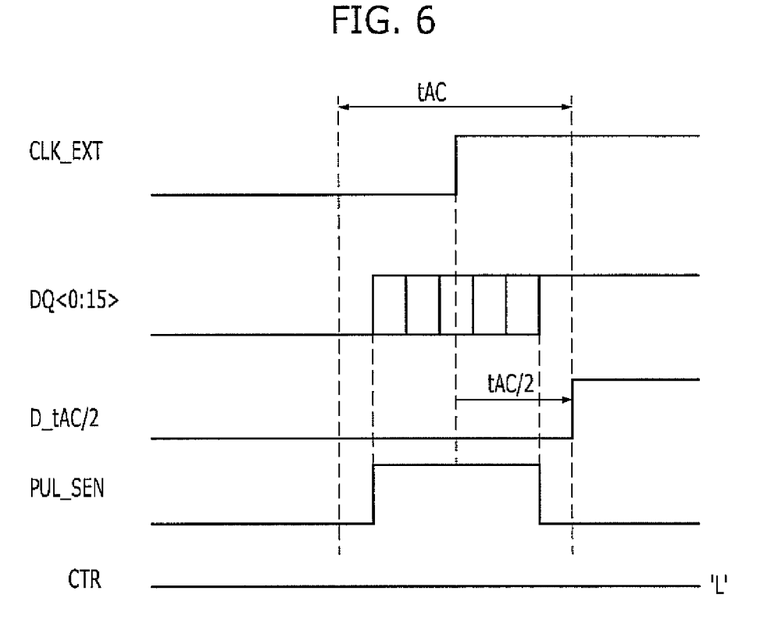
FIGS. 6 and 7 are timing diagrams illustrating the operation of the circuits of FIGS. 4 and 5.
Figure 7:
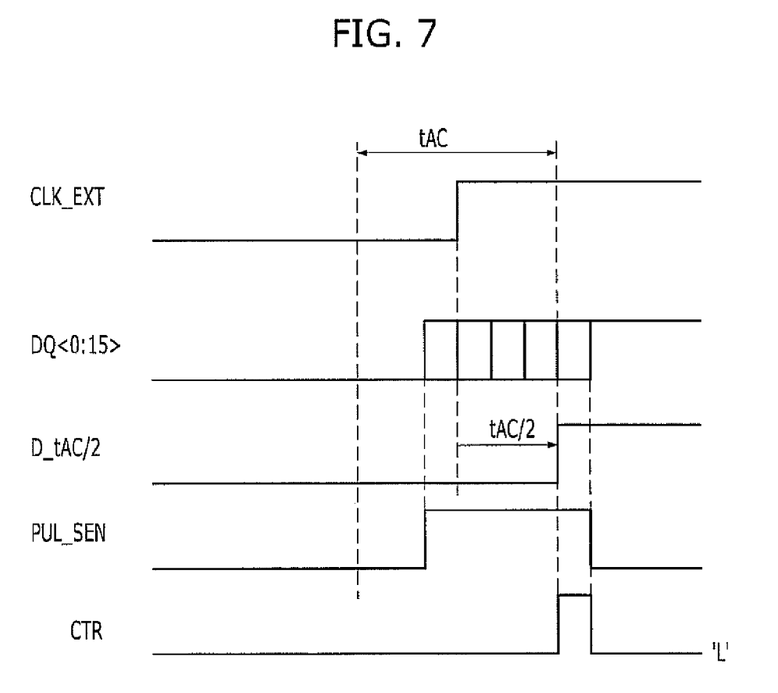

FIGS. 6 and 7 are timing diagrams illustrating the operation of the circuit of FIGS. 4 and 5.

The skew among the plurality of output data DQ<0:15> satisfies 'tAC' (that is, is within a time corresponding to tAC). The plurality of output data DQ<0:15> are outputted in synchronization with the internal clock signal CLK_INN as mentioned above with reference to FIG. 4. The plurality of output data DQ<0:15> may be delayed due to various factors. Thus, the plurality of output data DQ<0:15> may satisfy 'tAC' as illustrated in FIG. 6, or not satisfy 'tAC' as illustrated in FIG. 7 with respect to the external clock signal CLK_EXT.

Referring to FIGS. 4 to 6, the control signal output unit 520 outputs the control signal CTR in response to the delayed clock signal D_tAC/2, which is generated by delaying the external clock signal CLK_EXT by the delay amount corresponding to ½ of 'tAC', and the sensing result signal PUL_SEN. In this case, since the sensing result signal PUL_SEN is a logic low at the timing when the delayed clock signal D_tAC/2 changes to a logic high, the control signal CTR has a logic low.

The logic low of the control signal CTR means that the plurality of output data DQ<0:15> satisfy 'tAC' with respect to the external clock signal CLK_EXT. In other words, at the timing when the external clock signal CLK_EXT is delayed by the delay amount corresponding to ½ of 'tAC', all of the plurality of output data DQ<0:15> have been already transferred, which means that the plurality of output data DQ<0:15> satisfy 'tAC' with respect to the external clock signal CLK_EXT. At this time, the control signal CTR has a logic low, and the internal clock generation block 440 outputs the internal clock signal CLK_INN as previously generated based on the control signal CTR. Accordingly, the plurality of output data DQ<0:15> synchronized with the internal clock signal CLK_INN keeps the relation with the external clock signal CLK_EXT shown in FIG. 6.

Referring to FIGS. 4, 5 and 7, at the timing when the delayed clock signal D_tAC/2 changes to a logic high, the sensing result signal PUL_SEN is at a logic high. Therefore, the control signal CTR becomes a signal which includes a logic high.

The inclusion of a logic high in the control signal CTR means that the plurality of output data DQ<0:15> do not satisfy 'tAC' with respect to the external clock signal CLK_EXT. In other words, at the timing corresponding to a delay of the external clock signal CLK_EXT by the delay amount corresponding to ½ of 'tAC', if all of the plurality of output data DQ<0:15> have not yet been transferred, the plurality of output data DQ<0:15> do not satisfy 'tAC' with respect to the external clock signal CLK_EXT. At this time, the control signal CTR has a logic high, and the internal clock generation block 440 adjusts a delay amount of the internal clock signal CLK_INN according to the control signal CTR. Thereafter, according to the adjustment of the internal clock signal CLK_INN the transfer time of the plurality of output data DQ<0:15> synchronized with the internal clock signal CLK_INN is also adjusted. As a result, the plurality of output data DQ<0:15> and the external clock signal CLK_EXT are controlled to keep, for example, a relation as shown in FIG. 6.

As mentioned above, the semiconductor memory device in accordance with the embodiment of the present invention senses the skew among the plurality of data transferred through different paths, and generates the single sensing result signal. The sensing result signal generated in this manner can be detected through a single test pin. In this way, it is possible to minimize the number of test pins of the test equipment which are allocated to the semiconductor memory device.

Also, the semiconductor memory device in accordance with the embodiment of the present invention may detect the skew generated when the plurality of data are transferred. By applying this detection to the internal clock signal, 'tAC' of the data with respect to the external clock signal may be guaranteed.

While the present invention has been described with respect to the specific embodiments, it will be apparent to those skilled in the art that various changes and modifications may be made without departing from the spirit and scope of the invention as defined in the following claims.

Although 'tAC' has been explained representatively, the invention may be applied to not only 'tAC' but also 'tDQSCK' or 'tDQSS'.

Further, positions and types of the logic gates and the transistors described herein may also be differently implemented to accommodate switches in polarities of the input signals.

What is claimed is:

1. A skew detection circuit, comprising:
    a data sensing block configured to sense a first data that is transferred earliest and a last data that is transferred latest among a plurality of data which are transferred through different transfer paths, and generate a sensing result signal; and
    a detection signal generation block configured to compare an output signal of the data sensing block with a certain time, and generate a skew detection signal.

2. The skew detection circuit of claim 1, wherein the sensing result signal has a pulse width corresponding to a time between the first and second data transfers.

3. The skew detection circuit of claim 1, wherein the data sensing block comprises:
    a first data sensing unit configured to sense the first data;
    a second data sensing unit configured to sense the last data; and
    a sensing result output unit configured to generate the sensing result signal in response to output signals of the first and second data sensing units.

4. The skew detection circuit of claim 1, wherein the detection signal generation block comprises:
    a delay unit configured to delay a signal corresponding to the first data by the certain time, and output the delayed signal as a delay control signal; and
    a detection signal output unit configured to output the sensing result signal as the skew detection signal in response to the delay control signal.

5. The skew detection circuit of claim 4, wherein the detection signal output unit comprises:
    a transferring unit configured to transfer the sensing result signal in response to the delay control signal; and
    a latching unit configured to latch an output signal of the transferring unit, and output the latched signal as the skew detection signal.

6. The skew detection circuit of claim 1, wherein the certain time corresponds to a value for a minimum margin in data transfer.

7. The skew detection circuit of claim 1, wherein the certain time corresponds to one of 'tAC', 'tDQSCK', and 'tDQSS'.

8. The skew detection circuit of claim 1, wherein the skew detection signal is outputted through a single pad.

9. The skew detection circuit of claim 1, wherein the data sensing block senses a delay amount between the first data and the last data.

10. A semiconductor memory device, comprising:
    a data sensing block configured to sense a first data that is transferred earliest and a last data that is transferred latest among a plurality of data which are transferred through different transfer paths and synchronized with an internal clock signal, and generate a sensing result signal;
    a control signal generation block configured to compare a signal, which is generated by delaying an external clock signal by a certain time, with the sensing result signal, and generate a control signal; and
    an internal clock signal generation block configured to receive the external clock signal and adjust the internal clock signal in response to the control signal.

11. The semiconductor memory device of claim 10, further comprising a data output block configured to synchronize a plurality of data transferred through a plurality of data transmission lines with the internal clock signal, and output the synchronized data.

12. The semiconductor memory device of claim 10, wherein the control signal generation block comprises:
    a delay unit configured to delay the external clock signal by the certain time; and
    a control signal output unit configured to output the sensing result signal as the control signal in response to the sensing result signal.

13. The semiconductor memory device of claim 10, wherein the certain time corresponds to a value for a minimum margin in data transfer.

14. The semiconductor memory device of claim 10, wherein the certain time corresponds to ½ of one of 'tAC', 'tDQSCK' and 'tDQSS'.

15. The semiconductor memory device of claim 10, wherein the internal clock generation block controls a delay amount of the internal clock signal in response to the control signal.

16. The semiconductor memory device of claim 10, wherein the sensing result signal has a pulse width corresponding to a time between the first data and the second data transfers.

17. The semiconductor memory device of claim 10, wherein the data sensing block comprises:
    a first data sensing unit configured to sense the first data;
    a second data sensing unit configured to sense the last data; and
    a sensing result output unit configured to generate the sensing result signal in response to output signals of the first and second data sensing units.

18. The semiconductor memory device of claim 17, wherein the data sensing block senses a delay amount between the first data and the last data.

19. A method for detecting a data skew, the method comprising:
    comparing a delay amount between first data and last data among a plurality of data transferred through different transfer paths with a certain time, and detecting a comparison result; and
    outputting the comparison result through a single pad.

20. The method of claim 19, wherein the detecting of the comparison result comprises:
  sensing the first data and the last data and generating a sensing result signal; and
  comparing the sensing result signal with the certain time and outputting the skew detection signal.

21. The method of claim 20, wherein the outputting of the skew detection signal comprises:
  delaying a signal corresponding to the first data by the certain time; and
  outputting the sensing result signal as the skew detection signal in response to the delayed signal.

22. The method of claim 20, wherein the sensing result signal has a pulse width corresponding to the time between transfers of the first data and the last data.

23. The method of claim 19, wherein the certain time corresponds to a value for a minimum margin in data transfer.

24. The method of claim 19, wherein the certain time corresponds to one of 'tAC', 'tDQSCK' and 'tDQSS'.

25. A method for operating a semiconductor memory device, the method comprising:
  sensing a delay amount between first data and last data among a plurality of data, which are transferred through different transfer paths in sync with an internal clock signal, and generating a sensing result signal; and
  comparing a signal, which is generated by delaying an external clock signal by a certain time, with the sensing result signal, and controlling a delay amount of the internal clock signal.

26. The method of claim 25, wherein the sensing result signal has a pulse width corresponding to the time between the transfers of the first data and the last data.

27. The method of claim 25, wherein the controlling of the delay amount of the internal clock signal comprises:
  delaying the external clock signal by the certain time;
  outputting the delayed signal as a control signal in response to the sensing result signal; and
  adjusting the delay amount of the internal clock signal in response to the control signal.

28. The method of claim 25, wherein the certain time corresponds to a value for a minimum margin in data transfer.

29. The method of claim 25, wherein the certain time corresponds to ½ of one of 'tAC', 'tDQSCK' and 'tDQSS'.

* * * * *